(12) United States Patent
Omi

(10) Patent No.: US 7,705,414 B2
(45) Date of Patent: Apr. 27, 2010

(54) PHOTOELECTRIC CONVERSION DEVICE AND IMAGE SENSOR

(75) Inventor: Toshihiko Omi, Chiba (JP)

(73) Assignee: Seiko Instruments Inc., Chiba (JP)

( * ) Notice: Subject to any disclaimer, the term of this patent is extended or adjusted under 35 U.S.C. 154(b) by 346 days.

(21) Appl. No.: 11/713,244

(22) Filed: Mar. 2, 2007

(65) Prior Publication Data
US 2007/0210396 A1     Sep. 13, 2007

(30) Foreign Application Priority Data
Mar. 3, 2006     (JP) .............................. 2006-057549

(51) Int. Cl.
*H01L 29/78*     (2006.01)
(52) U.S. Cl. ............................... 257/431; 257/E31.001
(58) Field of Classification Search ................... 257/431
See application file for complete search history.

(56) References Cited

U.S. PATENT DOCUMENTS 5,777,742 A * 7/1998 Marron ........................ 356/458
5,786,627 A * 7/1998 Inoue et al. ................... 257/679
2004/0188597 A1 * 9/2004 Inoue et al. .............. 250/214 R

FOREIGN PATENT DOCUMENTS

JP     2000-311997 A     11/2000

\* cited by examiner

*Primary Examiner*—Kenneth A Parker
*Assistant Examiner*—Anthony Ho
(74) *Attorney, Agent, or Firm*—Brinks Hofer Gilson & Lione

(57) ABSTRACT

A photoelectric conversion device (10) includes a first conductivity type first semiconductor region (10a) located in a pixel region (11), a second conductivity type second semiconductor region (12) provided in the first semiconductor region (10a), for storing a signal charge, interconnecting portions (13 and 14) for connecting the second semiconductor region (12) with a circuit element provided outside the pixel region (11), and an organic film (16) which is provided above a portion located in the pixel region (11) in the interconnecting portions (13 and 14) through an insulating protective film (15) and held at a predetermined potential. The organic film (16) is made of a thermoplastic polyimide resin containing one of a conductive particle and a conductive fiber.

8 Claims, 1 Drawing Sheet

PHOTOELECTRIC CONVERSION DEVICE AND IMAGE SENSOR

This application claims priority under 35 U.S.C. §119 to Japanese Patent Application No. JP2006-057549 filed Mar. 3, 2006, the entire content of which is hereby incorporated by reference.

BACKGROUND OF THE INVENTION

1. Field of the Invention

The present invention relates to a photoelectric conversion device and an image sensor.

2. Description of the Related Art

As for an example of photoelectric conversion device, there is known a structure as described in, for example, JP 2000-311997 A, which includes a first semiconductor region of a first conductivity type located in a pixel region, a second semiconductor region of a second conductivity type provided in the first semiconductor region for storing a signal charge, a interconnecting portion for connecting the second semiconductor region with a circuit element provided outside the pixel region, and an electrical conductor which is provided above a portion located in the pixel region in the interconnecting portion through an insulating protective film and held at a predetermined potential. In such a structure, a photodiode serving as a light receiving element is formed by a semiconductor PN junction in the pixel region.

Providing the electrical conductor enables, for example, shielding of noise from the outside of the photoelectric conversion device to the interconnecting portion, reducing the electrical influence of the noise on the interconnecting portion. The electrical conductor is made of a metal material such as aluminum, copper, molybdenum, tungsten, or titanium.

Since the electrical conductor is, however, made of the metal material according to the conventional photoelectric conversion device, a pattern made of two metal materials for two layers, one for an interconnecting line of the interconnecting portion and the other for the electrical conductor, is provided in the photoelectric conversion device, making it difficult to reduce a manufacturing steps and resulting cost thereof.

During a process for manufacturing the photoelectric conversion device, for example, a conductive contaminant may be stuck to an upper surface of the interconnecting portion. Presence of a parasitic capacitance caused between the interconnecting portion and the conductive contaminant in parallel to a capacitance of the photodiode increases an effective capacitance of the photodiode, which reduces the sensitivity thereof. The sensitivity is represented by a voltage generated by charges stored in the photodiode and is inversely proportional to the effective capacitance of the photodiode.

SUMMARY OF THE INVENTION

The present invention has been made in view of the above-mentioned circumstances. An object of the present invention is to provide a photoelectric conversion device capable of reducing a manufacturing cost and preventing a reduction in sensitivity of a photodiode caused by an increase in effective capacitance thereof even when a conductive contaminant or the like is stuck to an upper surface of a interconnecting portion during a manufacturing process, and an image sensor including the photoelectric conversion device.

In order to solve the above-mentioned problems and to achieve the object, according to a first aspect of the present invention, a photoelectric conversion device includes: a first semiconductor region of a first conductivity type which is located in a pixel region; a second semiconductor region of a second conductivity type which is provided in the first semiconductor region, for storing a signal charge; a interconnecting portion for connecting the second semiconductor region with a circuit element provided outside the pixel region; and an organic film provided above the interconnecting portion through an insulating protective film. The organic film includes a thermoplastic polyimide resin containing one of a conductive particle and a conductive fiber.

According to a second aspect of the present invention, an image sensor includes: a photoelectric conversion device; a light source for emitting light to an object; and an imaging element for condensing light reflected from the object and imaging the reflected light into the photoelectric conversion device. The photoelectric conversion device is the photoelectric conversion device according to the first aspect.

According to the aspects of the present invention, formation of the organic film by the thermoplastic polyimide resin containing conductive particles or conductive fibers enables the setting of the thickness of the organic film to approximately 2 μm to 10 μm, resulting in the large distance between an upper surface of the organic film and an upper surface of the interconnecting line of the interconnecting portion in the photoelectric conversion device. In the pixel region of a photodiode formed as a light receiving element by a semiconductor PN junction, it is thus possible to suppress the increase in capacitance, which is caused by sticking of conductive contaminants or the like to the upper surface of the organic film, preventing the reduction in sensitivity of the photodiode. In addition, formation of the organic film of the polyimide resin enables reduction in, for example, a time necessary to form a second-layer metal film and to etch this film as compared with that in the case where a conductor made of only a metal material is used, reducing manufacturing time thereof, and also manufacturing cost thereof.

According to the photoelectric conversion device and the image sensor of the present invention, the manufacturing cost can be reduced. In addition, even when the conductive contaminant or the like is stuck to the upper surface of the organic film during the manufacturing process, the reduction in sensitivity of the photodiode caused by the increase in capacitance thereof can be prevented.

DETAILED DESCRIPTION OF THE PREFERRED EMBODIMENT

Figure 1:
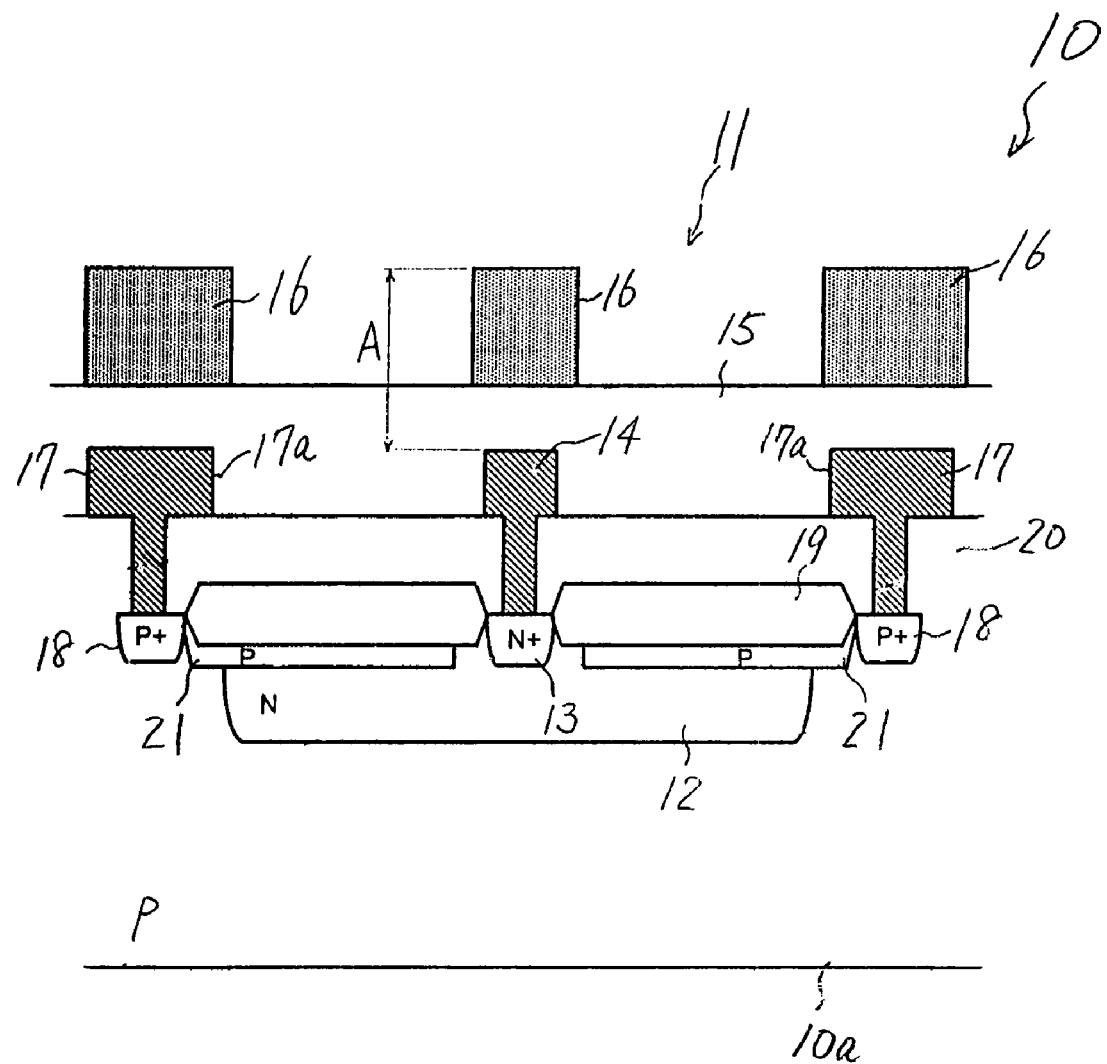
FIG. 1 is a longitudinal cross sectional view showing a photoelectric conversion device according to an embodiment of the present invention.

Hereinafter, an embodiment of the present invention will be described with reference to FIG. 1. A photoelectric conversion device 10 according to this embodiment includes a first conductivity type semiconductor substrate (first semiconductor region) 10a, a second conductivity type semiconductor region (second semiconductor region) 12 provided in a pixel region 11 of the semiconductor substrate 10a, for storing a signal charge, interconnecting portions 13 and 14 for connecting the semiconductor region 12 with a circuit element (not shown) provided outside the pixel region 11, and an organic film 16 provided above a portion of the interconnecting portions 13 and 14 located in the pixel region 11 through an insulating protective film 15.

In the example shown in FIG. 1, the semiconductor substrate 10a is set as a P-type region and the semiconductor region 12 is set as an N-type region. A light-shielding layer 17 is provided on a surface side of the semiconductor substrate 10a. In the two-dimensional view, the semiconductor substrate 10a is partitioned by a two-dimensional rectangular opening portion 17a formed in the light-shielding layer 17, thereby specifying the pixel region 11. The light-shielding layer 17 is connected with a power source (not shown) and is held at a predetermined potential. The interconnecting portions correspond to the N+ type region 13 provided in the semiconductor region 12 and the interconnecting line 14 made of a metal material, for connecting the N+ type region 13 with the circuit element. The signal charge stored in the semiconductor region 12 can thus be supplied to the circuit element through the N+ type region 13 and the interconnecting line 14 sequentially.

In the two-dimensional view of the photoelectric conversion device 10, a P+ type pixel separation region 18 formed in a ring shape so as to surround the semiconductor region 12 and the N+ type region 13 is provided under the light-shielding layer 17. A field oxide film 19 is located above the semiconductor region 12 and between the pixel separation region 18 and the N+ type region 13.

Note that the N+ type region 13, the pixel separation region 18, and the field oxide film 19 are formed to the surface of the semiconductor substrate 10a. An insulating film 20 is provided between the surface of the semiconductor substrate 10a and the insulating protective film 15. The interconnecting line 14 is extended from a surface of the N+ type region 13 to a surface of the insulating film 20. The light-shielding layer 17 is extended from a surface of the pixel separation region 18 to the surface of the insulating film 20.

A P-type region 21 for electrically insulating the field oxide film 19 and the semiconductor region 12 is located therebetween. The P-type region 21 is electrically connected with an upper surface of the semiconductor region 12 and the pixel separation region 18. Note that the P-type region 21 is formed to be capable of electrically shielding a portion other than a portion in which the N+ type region 13 is located in the surface of the semiconductor region 12, from the outside.

In the above-mentioned structure, a photodiode is formed by a PN junction between the semiconductor region 12 and the semiconductor substrate 10a plus the P-type region 21. Accordingly the signal charge obtained by the photoelectric conversion of the photodiode is stored in the semiconductor region 12.

In this embodiment, the organic film 16 is made of a thermoplastic polyimide resin containing conductive particles or conductive fibers. A thickness of the organic film 16 is set to approximately 2 μm to 10 μm. A distance between a surface of the insulating protective film 15 (that is, a lower surface of the organic film 16) and an upper surface of the interconnecting line 14 is set to approximately 1 μm to 1.5 μm. Consequently a distance "A" between an upper surface of the organic film 16 and the upper surface of the interconnecting line 14 is approximately 3 μm to 11.5 μm.

In this embodiment, the organic film 16 is located above the light-shielding layer 17 through the insulating protective film 15, thereby further improving a light-shielding characteristic.

The organic film 16 can be formed as follows. The polyimide resin is applied to the entire surface of the insulating protective film 15 and then unnecessary portion of the polyimide resin is removed by, for example, a photoetching method.

The photoelectric conversion device 10 having the above-mentioned structure is provided in an image sensor which includes a light source for emitting light to an object and an imaging element for condensing light reflected from the object and imaging the reflected light in the photoelectric conversion device 10.

As described above, according to the semiconductor device manufacturing method and the semiconductor device in this embodiment, the formation of the organic film 16 by the thermoplastic polyimide resin containing conductive particles or conductive fibers enables the setting of the thickness of the organic film 16 to approximately 2 μm to 10 μm, resulting the large distance "A" between the upper surface of the organic film 16 and the upper surface of the interconnecting line 14 in the photoelectric conversion device 10.

Thus, it is possible to minimize an increase in capacitance of the photodiode which is caused by the sticking of conductive contaminants or the like to the upper surface of the organic film 16, so that a reduction in sensitivity of the photodiode can be prevented. In addition, when the organic film 16 is made of the polyimide resin, for example, a time necessary for etching can be shortened as compared with that in the case where a conductor made of only a metal material is used. Consequently, a manufacturing time can be shortened, and a manufacturing cost can be reduced.

Moreover no manufacturing inconvenience occurs in making the organic film 16 of the polyimide resin since the polyimide resin has a melting point of 200° C. or more, which is higher than that of solder.

The technical scope of the present invention is not limited to this embodiment, and thus, various modifications can be made without departing from the spirit of the present invention.

For example, the conductivity types in this embodiment may all be reversed to construct a photoelectric conversion device.

In this embodiment, the pixel region 11 having the two-dimensional rectangular shape is described. However, this shape is not particularly limited. For example, a circular shape may be used.

In this embodiment, the structure in which the organic film 16 is located above the light-shielding layer 17 through the insulating protective film 15 is described. However, the organic film 16 is not necessarily located above the light-shielding layer 17.

The organic film 16 may be located on, for example, the entire surface of the insulating protective film 15.

In this embodiment, the second conductivity type semiconductor region 12 is formed in the pixel region 11 of the first conductivity type semiconductor substrate 10a. Instead of this, for example, a first conductivity type first semiconductor region may be formed in the pixel region 11 of the semiconductor substrate 10a and a second conductivity type second semiconductor region may be formed in the first semiconductor region.

Manufacturing cost can, thus, be reduced. In addition, even when a conductive contaminant or the like is attached to an upper surface of a interconnecting portion during a manufacturing process, a reduction in sensitivity of a photodiode can be prevented without an increase in capacitance thereof.

What is claimed is:

1. A photoelectric conversion device, comprising:
   a first semiconductor region of a first conductivity type which is located in a pixel region;
   a second semiconductor region of a second conductivity type which is provided in the first semiconductor region, for storing a signal charge;

a interconnecting portion for connecting the second semiconductor region with a circuit element provided outside the pixel region;
an organic film provided above the interconnecting portion through an insulating protective film;
a pixel separation region above a portion of the first semiconductor region, the pixel separation region comprising one of a P+ type region and a N+ type region; and
a light shielding layer above the pixel separation region,
wherein the organic film comprises a thermoplastic polyimide resin containing one of a conductive particle and a conductive fiber, and
wherein a distance between an upper surface of the organic film and an upper surface of the interconnecting portion is between approximately 3 µm and approximately 11.5 µm.

2. An image sensor, comprising:
a photoelectric conversion device;
a light source for emitting light to an object; and
an imaging element for condensing light reflected from the object and imaging the reflected light into the photoelectric conversion device,
wherein the photoelectric conversion device comprises the photoelectric conversion device according to claim 1.

3. The photoelectric conversion device of claim 1, the organic film comprising a thickness of between approximately 2 µm and approximately 10 µm.

4. The photoelectric conversion device of claim 1, further comprising an insulating protective film between the organic film and the interconnecting portion.

5. The photoelectric conversion device of claim 4, where a distance between an upper surface of the insulating protective film and an upper surface of the interconnecting portion is between approximately 1 µm and approximately 1.5 µm.

6. The photoelectric conversion device of claim 4, where the organic film is positioned above a portion of the insulating protective film.

7. The photoelectric conversion device of claim 4, where the organic film is positioned above an entire upper surface of the insulating protective film.

8. The photoelectric conversion device of claim 1, where the interconnecting region comprises:
a metal interconnecting line; and
an interconnect semiconductor region below the metal interconnecting line, the interconnect semiconductor region comprising one of an N+ type region and a P+ type region.

* * * * *